(12) United States Patent
Witt et al.

(10) Patent No.: US 6,202,139 B1
(45) Date of Patent: Mar. 13, 2001

(54) PIPELINED DATA CACHE WITH MULTIPLE PORTS AND PROCESSOR WITH LOAD/STORE UNIT SELECTING ONLY LOAD OR STORE OPERATIONS FOR CONCURRENT PROCESSING

(75) Inventors: David B. Witt; James K. Pickett, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/100,291

(22) Filed: Jun. 19, 1998

(51) Int. Cl.[7] ............................ G06F 13/00; G06F 9/312; G06F 1/04; G11C 11/413

(52) U.S. Cl. ...................... 711/169; 711/167; 711/131; 711/149; 711/140; 365/189.05; 365/230.05; 710/6; 710/39

(58) Field of Search ............................ 711/167, 168, 711/169, 131, 140, 149, 157; 365/230.05, 189.05; 710/5, 6, 39; 712/214, 225, 245

(56) References Cited

U.S. PATENT DOCUMENTS

| | | | |
|---|---|---|---|
| 5,341,341 | * | 8/1994 | Fukuzo ............................ 365/233 |
| 5,557,768 | * | 9/1996 | Braceras et al. ................. 711/131 |
| 5,559,986 | * | 9/1996 | Alpert et al. ..................... 711/144 |
| 5,596,740 | * | 1/1997 | Quattromani et al. ........... 711/157 |
| 5,619,674 | * | 4/1997 | Ikumi ............................... 711/131 |
| 5,832,297 | * | 11/1998 | Ramagopal et al. .............. 710/5 |
| 5,905,680 | * | 5/1999 | Bosshart ...................... 365/189.07 |
| 5,964,884 | * | 10/1999 | Partovi et al. ................... 713/503 |
| 6,038,645 | * | 3/2000 | Nanda et al. .................... 711/141 |
| 6,105,123 | * | 8/2000 | Raje ................................. 712/24 |

OTHER PUBLICATIONS

Patterson et al, "Computer Architecture: A Quantitative Approach," Morgan Kaufman Publishers, Inc., San Mateo, CA, 1990, pp. 361–363; and 429–431.

Gwenneap, L., "Digital 21264 Sets New Standard: Clock Speed, Complexity, Performance Surpass Records, But Still A Year Away," Microdesign Resources, Oct. 28, 1996, Microprocessor Report, vol. 10, No. 14, pp. 86–91.

* cited by examiner

*Primary Examiner*—Glenn Gossage
(74) *Attorney, Agent, or Firm*—Conley, Rose & Tayon, PC; Lawrence J. Merkel (57) ABSTRACT

A computer system includes a processor having a cache which includes multiple ports, although a storage array included within the cache may employ fewer physical ports than the cache supports. The cache is pipelined and operates at a clock frequency higher than that employed by the remainder of a microprocessor including the cache. In one embodiment, the cache preferably operates at a clock frequency which is at least a multiple of the clock frequency at which the remainder of the microprocessor operates. The multiple is equal to the number of ports provided on the cache (or the ratio of the number of ports provided on the cache to the number of ports provided internally, if more than one port is supported internally). Accordingly, the accesses provided on each port of the cache during a clock cycle of the microprocessor clock can be sequenced into the cache pipeline prior to commencement of the subsequent clock cycle. In one particular embodiment, the load/store unit of the microprocessor is configured to select only load memory operations or only store memory operations for concurrent presentation to the data cache. Accordingly, the data cache may be performing only reads or only writes to its internal array during a clock cycle. The data cache may implement several techniques for accelerating access time based upon this feature. For example, the bit lines within the data cache array may be only balanced between accesses instead of precharging (and potentially balancing).

39 Claims, 8 Drawing Sheets

PIPELINED DATA CACHE WITH MULTIPLE PORTS AND PROCESSOR WITH LOAD/STORE UNIT SELECTING ONLY LOAD OR STORE OPERATIONS FOR CONCURRENT PROCESSING

BACKGROUND OF THE INVENTION

1. Field of the Invention

The present invention is related to the field of microprocessors and, more particularly, to data caches employed within microprocessors.

2. Description of the Related Art

Superscalar microprocessors attempt to achieve high performance by issuing/executing multiple instructions concurrently. To the extent that superscalar microprocessors are successful at issuing/executing multiple instructions concurrently, high performance may be realized. Several factors may influence the successful concurrent issue/execution of instructions. For example, a first instruction which is dependent upon a second instruction (e.g. for a source operand) generally does not issue/execute concurrently with the first instruction. Still further, the frequency of branch instructions (which determine which instructions will be fetched next from a variety of sources) may impact the number of instructions available for issue and hence the number of instructions issued concurrently.

In the continuing evolution of superscalar microprocessors, the maximum issue rate (i.e. the number of instructions which can be concurrently issued) has been increasing. In other words, a trend toward wider issue superscalar microprocessors has been occurring. While additional performance gains may be realized by allowing for larger numbers of instructions to concurrently issue, wider issue microprocessors may face additional design challenges as well.

Among the additional design challenges is providing sufficient data cache ports for the number of memory operations which may be concurrently issued. As used herein, the term "port", in connection with a cache, refers to a facility for accessing the cache in response to one memory operation. Other memory operations use other ports for accessing the cache concurrently. Superscalar microprocessors generally include data caches to decrease the latency of access to memory operands. Instruction sequences include a certain number of memory operations to access and/or update memory operands. Generally speaking, a memory operation specifies the transfer of data between the microprocessor and a memory external to the microprocessor (although the transfer may be completed via an internal cache). Load memory operations specify the transfer of data from a memory to the microprocessor, while store memory operations specify the transfer of data from the microprocessor to the memory. Memory operations may be explicit instructions, or an implicit part of another instruction specifying a memory operand, depending upon the instruction set architecture employed by the microprocessor.

As issue rates increase, the number of memory operations for which concurrent access to a cache is desired increases as well. If concurrent access is not provided (by providing sufficient data cache ports), then performance generally degrades. For example, many instructions are dependent upon load memory operations (either directly or indirectly) for source operands. Such dependent instructions typically cannot execute if the load memory operations are stalled due to a lack of available cache ports. Additionally, pipeline stalls may develop if subsequent memory operations attempt to issue prior to execution of prior memory operations and the available resources for queuing memory operations become full.

Various methods for multiporting data caches have been employed in the past. For example, the cache arrays may be physically multiported (allowing for concurrent access to any storage location within the array from each port in parallel with access to any other storage location from the other ports). Unfortunately, physically multiporting the array typically leads to large increases in the microprocessor chip area occupied by the array. The size of the chip is important to chip yields and number of chips per semiconductor wafer, and hence to the cost of producing the microprocessor. Accordingly, increase in the area occupied by a cache array is generally undesirable.

Another method employed to provide multiported cache access is to bank the cache. Each port may access one of the banks in parallel with a different port accessing a different bank. If two or more memory operations which would otherwise concurrently access the data cache actually access data within the same bank, one of the memory operations completes and the others are inhibited. Unfortunately, even with a large number of available ports, concurrent access to the data cache may not be achieved due to the occurrence of bank conflicts. Accordingly, a solution to multiporting a data cache which does not incur the disadvantages of physically multiporting the array or banking the cache is desired.

SUMMARY OF THE INVENTION

The problems outlined above are in large part solved by a cache in accordance with the present invention. The cache includes multiple ports, although the storage array included within the cache employs fewer ports than the cache supports. The cache is pipelined and operates at a clock frequency higher than that employed by the remainder of a microprocessor including the cache. Advantageously, the multiple accesses can be pipelined through the cache and the cache may internally have fewer ports than the number of ports actually supported by the cache. Accordingly, the cache may be implementable in a smaller area than a cache supporting more ports internally. Additionally, since the accesses are pipelined instead of applied to separate banks, the performance losses due to bank conflicts may be avoided. The cache may provide multiport access to support wide issue superscalar microprocessors in a small area and with high performance.

In one embodiment, the cache preferably operates at a clock frequency which is at least a multiple of the clock frequency at which the remainder of the microprocessor operates. The multiple is equal to the number of ports provided on the cache (or the ratio of the number of ports provided on the cache to the number of ports provided internally, if more than one port is supported internally). Accordingly, the accesses provided on each port of the cache during a clock cycle of the microprocessor clock can be sequenced into the cache pipeline prior to commencement of the subsequent clock cycle.

In one particular embodiment, the load/store unit of the microprocessor is configured to select only load memory operations or only store memory operations for concurrent presentation to the data cache. Accordingly, the data cache may be performing only reads or only writes to its internal array during a clock cycle. The data cache may implement several techniques for accelerating access time based upon this feature. For example, the bit lines within the data cache array may be only balanced between accesses instead of precharging (and potentially balancing).

Broadly speaking, the present invention contemplates a cache comprising a plurality of ports and a pipeline. The plurality of ports are operable at a first clock frequency and each of the plurality of ports is configured to concurrently receive a different cache access according to a first clock signal operable at the first clock frequency. Coupled to the plurality of ports, the pipeline is configured to perform one cache access per clock cycle of a second clock signal operable at a second clock frequency. The second clock frequency is at least a multiple of the first clock frequency, wherein the multiple is equal to a number of the plurality of ports.

The present invention further contemplates a processor comprising a data cache having a plurality of ports and a load/store unit. Coupled to the data cache, the load/store unit is configured to select a memory operation for each of the plurality of ports. The load/store unit is configured to select only load memory operations for concurrent presentation on the plurality of ports or only store memory operations for concurrent presentation on the plurality of ports.

Moreover, the present invention contemplates a computer system comprising a processor and an input/output (I/O) device. The processor includes a data cache having a plurality of ports and a load/store unit configured to select a memory operation for each of the plurality of ports. The load/store unit is additionally configured to select only load memory operations for concurrent presentation on the plurality of ports or only store memory operations for concurrent presentation on the plurality of ports. The data cache comprises an array having a number of ports less than a number of the plurality of ports. The array is operable at a first clock frequency which is a multiple of a second clock frequency at which the load/store unit is operable. The data cache is pipelined in stages operable at the first clock frequency to provide access from each of the plurality of ports. The I/O device is configured to provide communication between the computer system and another computer system to which the I/O device is coupled.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
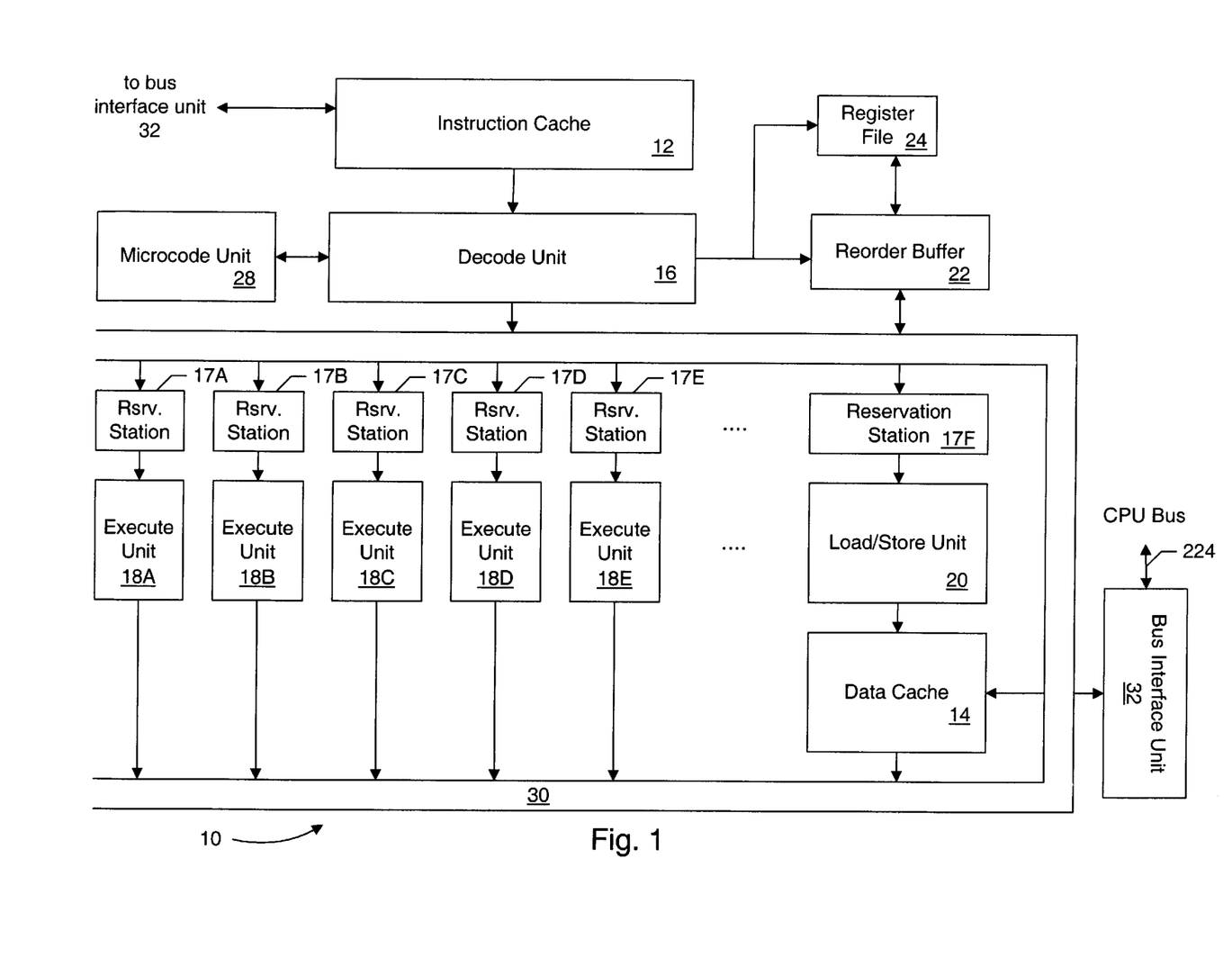
FIG. 1 is a block diagram of a microprocessor.

Turning now to FIG. 1, a block diagram of one embodiment of a microprocessor 10 is shown. Other embodiments are possible and contemplated. As shown in FIG. 1, microprocessor 10 includes an instruction cache 12, a data cache 14, a decode unit 16, a plurality of reservation stations including reservation stations 17A–17F, a plurality of execute units 18A–18E, a load/store unit 20, a reorder buffer 22, a register file 24, a microcode unit 28, and a bus interface unit 32. Elements referred to herein with a particular reference number followed by a letter will be collectively referred to by the reference number alone. For example, the plurality of execute units will be collectively referred to herein as execute units 18. Execute units 18 may include more or fewer execute units than execute units 18A–18E shown in FIG. 1.

As shown in FIG. 1, instruction cache 12 is coupled to bus interface unit 32 and to decode unit 16, which is further coupled to reservation stations 17, reorder buffer 22, register file 24, and microcode unit 28. Reorder buffer 22, execute units 18, and data cache 14 are each coupled to a result bus 30 for forwarding of execution results. Furthermore, reservation stations 17A–17E are coupled to a respective execute unit 18A–18E, while reservation station 17F is coupled to load/store unit 20. Each reservation station 17 is coupled to receive operand information from reorder buffer 22. Load/store unit 20 is coupled to data cache 14, which is further coupled to bus interface unit 32. Bus interface unit 32 is coupled to a CPU bus 224.

Generally speaking, microprocessor 10 employs a multi-ported data cache 14, allowing for multiple memory operations to be performed in parallel. The array within data cache 14 is physically single ported, but data cache 14 is pipelined into multiple stages. The pipeline within data cache 14 is operated at a clock frequency which is a multiple of the clock frequency at which the remainder of microprocessor 10 operates. The multiple of the clock frequency may be greater than or equal to the number of ports provided on data cache 14. The operations from the various ports are sequenced into the pipeline to provide multiple concurrent access (as viewed by the remainder of microprocessor 10 operating at the lower clock frequency). Before the end of the clock cycle in which multiple memory operations are presented for cache access, each of the memory operations has been sequenced into the pipeline. Accordingly, a subsequent set of memory operations may be presented in the next clock cycle to the data cache ports of data cache 14. Advantageously, multiple ports are supported without physically multiporting the array within data cache 14. Furthermore, data cache 14 may be a non-banked structure. Therefore, bank conflicts are eliminated. Memory operations may be selected for access without regard to which memory locations are accessed within data cache 14, and the operations may complete cache access uninhibited.

Microprocessor 10 as shown in FIG. 1 is a wide-issue superscalar microprocessor and hence performing multiple memory operations via multiple ports on data cache 14 may support high execution rates by rapidly providing memory operands for instructions. Load/store unit 20 receives memory operations corresponding to any instructions which may be dispatched to execute units 18 as well as any instructions which may be purely memory operations (i.e. load/store instructions). Load/store unit 20 may be configured to generate addresses for memory operations, or may be configured to receive addresses from separate address generation units. In yet another alternative, load/store unit 20 may be configured to receive addresses from execute units 18.

In one embodiment, load/store unit 20 is configured to select only load memory operations or only store memory operations for concurrent presentation to data cache 14. Accordingly, data cache 14 may be performing only reads or only writes to its internal array during a clock cycle. Data cache 14 may implement several techniques for accelerating access time based upon this feature, as described in more detail below. In one exemplary embodiment, data cache 14 may include four ports and hence may perform up to four load memory operations or four store memory operations per clock cycle. Store memory operations may be performed via two accesses, according to one particular embodiment. During the first access, the affected cache lines are read from data cache 14. During the second access, the affected cache lines are updated with the store data. The store memory operations may be speculatively performed without first determining a hit/miss status within data cache 14. If a store memory operation is a miss, the data read in the first access for the store may be written to memory (if updated while in data cache 14) and the remainder of the cache line updated by the store memory operation may be read from memory.

As used herein, the term "clock frequency" refers to the inverse of the period of a clock signal used to clock a pipeline. For example, the pipelines employed within microprocessor 10 for instruction processing are clocked at a first clock frequency corresponding to an ICLK signal as discussed in more detail below. The pipeline within data cache 14 is clocked at a second clock frequency corresponding to a CLK1 signal and a CLK2 signal as discussed in more detail below. The second clock frequency is at least a multiple of the first clock frequency, wherein the multiple is equal to the number of ports on data cache 14. One period of a clock signal is referred to as a "clock cycle" as used herein, and describes the amount of time within which each stage of a pipeline completes its work upon a particular item and is therefore ready for a new item at commencement of the next clock cycle. Generally, a pipeline is a set of two or more stages designed to accomplish a function, wherein multiple items may be in the pipeline (one per stage) such that processing of the function upon each item may be overlapped with the processing of other items. Each stage within the pipeline performs a predetermined portion of the overall function upon each item conveyed to that stage.

Instruction cache 12 is a high speed cache memory for storing instructions. It is noted that instruction cache 12 may be configured into a set-associative or direct mapped configuration. Instruction cache 12 may additionally include a branch prediction mechanism for predicting branch instructions as either taken or not taken. Instructions are fetched from instruction cache 12 and conveyed to decode unit 16 for decoding and dispatch to a reservation station 17.

Decode unit 16 decodes each instruction fetched from instruction cache 12. Decode unit 16 dispatches the instruction to one or more of reservation stations 17 depending upon the type of instruction detected. For example, if a given instruction includes a memory operand, decode unit 16 may signal load/store unit 20 to perform a load/store (i.e. read/write) memory operation in response to the given instruction.

Decode unit 16 also detects the register operands used by the instruction and requests these operands from reorder buffer 22 and register file 24. In one embodiment, execute units 18 are symmetrical execution units. Symmetrical execution units are each configured to execute a particular subset of the instruction set employed by microprocessor 10. The subsets of the instruction set executed by each of the symmetrical execution units are the same. In another embodiment, execute units 18 are asymmetrical execution units configured to execute dissimilar instruction subsets. For example, execute units 18 may include a branch execute unit for executing branch instructions, one or more arithmetic/logic units for executing arithmetic and logical instructions, and one or more floating point units for executing floating point instructions. Decode unit 16 dispatches an instruction to a reservation station 17 which is coupled to an execute unit 18 or load/store unit 20 which is configured to execute that instruction.

Microcode unit 28 is included for handling instructions for which the architecturally defined operation is more complex than the hardware employed within execute units 18 and load/store unit 20 may handle. Microcode unit 28 parses the complex instruction into multiple instructions which execute units 18 and load/store unit 20 are capable of executing.

Load/store unit 20 provides an interface between execute units 18 and data cache 14. Load and store memory operations are performed by load/store unit 20 to data cache 14. Additionally, memory dependencies between load and store memory operations are detected and handled by load/store unit 20.

Reservation stations 17 are configured to store instructions whose operands have not yet been provided. An instruction is selected from those stored in a reservation station 17A–17F for execution if: (1) the operands of the instruction have been provided, and (2) the instructions within the reservation station 17A–17F which are prior to the instruction being selected in program order have not yet received operands. It is noted that a centralized reservation station may be included instead of separate reservations stations. The centralized reservation station is coupled between decode unit 16, execute units 18, and load/store unit 20. Such an embodiment may perform the dispatch function within the centralized reservation station.

Microprocessor 10 supports out of order execution, and employs reorder buffer 22 for storing execution results of speculatively executed instructions and storing these results into register file 24 in program order, for performing dependency checking and register renaming, and for providing for mispredicted branch and exception recovery. When an instruction is decoded by decode unit 16, requests for register operands are conveyed to reorder buffer 22 and register file 24. In response to the register operand requests, one of three values is transferred to the reservation station 17A–17F which receives the instruction: (1) the value stored in reorder buffer 22, if the value has been speculatively generated; (2) a tag identifying a location within reorder buffer 22 which will store the result, if the value has not been speculatively generated; or (3) the value stored in the register within register file 24, if no instructions within reorder buffer 22 modify the register. Additionally, a storage location within reorder buffer 22 is allocated for storing the results of the instruction being decoded by decode unit 16. The storage location is identified by a tag, which is conveyed to the unit receiving the instruction. It is noted that, if more than one reorder buffer storage location is allocated for storing results corresponding to a particular register, the value or tag corresponding to the last result in program order is conveyed in response to a register operand request for that particular register.

When execute units 18 or load/store unit 20 execute an instruction, the tag assigned to the instruction by reorder buffer 22 is conveyed upon result bus 30 along with the result of the instruction. Reorder buffer 22 stores the result in the indicated storage location. Additionally, reservation stations 17 compare the tags conveyed upon result bus 30 with tags of operands for instructions stored therein. If a match occurs, the reservation station captures the result from result bus 30 and stores it with the corresponding instruction. In this manner, an instruction may receive the operands it is intended to operate upon. Capturing results from result bus 30 for use by instructions is referred to as "result forwarding".

Instruction results are stored into register file 24 by reorder buffer 22 in program order. Storing the results of an instruction and deleting the instruction from reorder buffer 22 is referred to as "retiring" the instruction. By retiring the instructions in program order, recovery from incorrect speculative execution may be performed. For example, if an instruction is subsequent to a branch instruction whose taken/not taken prediction is incorrect, then the instruction may be executed incorrectly. When a mispredicted branch instruction or an instruction which causes an exception is detected, reorder buffer 22 discards the instructions subsequent to the mispredicted branch instructions. Instructions thus discarded are also flushed from reservation stations 17, execute units 18, load/store unit 20, and decode unit 16.

Register file 24 includes storage locations for each register defined by the microprocessor architecture employed by microprocessor 10. For example, microprocessor 10 may employ the x86 microprocessor architecture. For such an embodiment, register file 24 includes locations for storing the EAX, EBX, ECX, EDX, ESI, EDI, ESP, and EBP register values.

Data cache 14 is a high speed cache memory configured to store data to be operated upon by microprocessor 10. It is noted that data cache 14 may be configured into a set-associative or direct-mapped configuration. Data cache 14 allocates and deallocates storage for data in cache lines. In other words, a cache line is a block of contiguous bytes which is allocated and deallocated from a cache as a unit.

Bus interface unit 32 effects communication between microprocessor 10 and devices coupled thereto via CPU bus 224. For example, instruction fetches which miss instruction cache 12 may be transferred from a main memory by bus interface unit 32. Similarly, data requests performed by load/store unit 20 which miss data cache 14 may be transferred from main memory by bus interface unit 32. Additionally, data cache 14 and/or a victim cache (not shown) may discard a cache line of data which has been modified by microprocessor 10. Bus interface unit 32 transfers the modified line to the main memory.

It is noted that decode unit 16 may be configured to dispatch an instruction to more than one execution unit. For example, in embodiments of microprocessor 10 which employ the x86 microprocessor architecture, certain instructions may operate upon memory operands. Executing such an instruction involves transferring the memory operand from data cache 14, executing the instruction, and transferring the result to memory (if the destination operand is a memory location) or data cache 14. Load/store unit 20 performs the memory operations, and an execute unit 18 performs the execution of the instruction.

Figure 2:
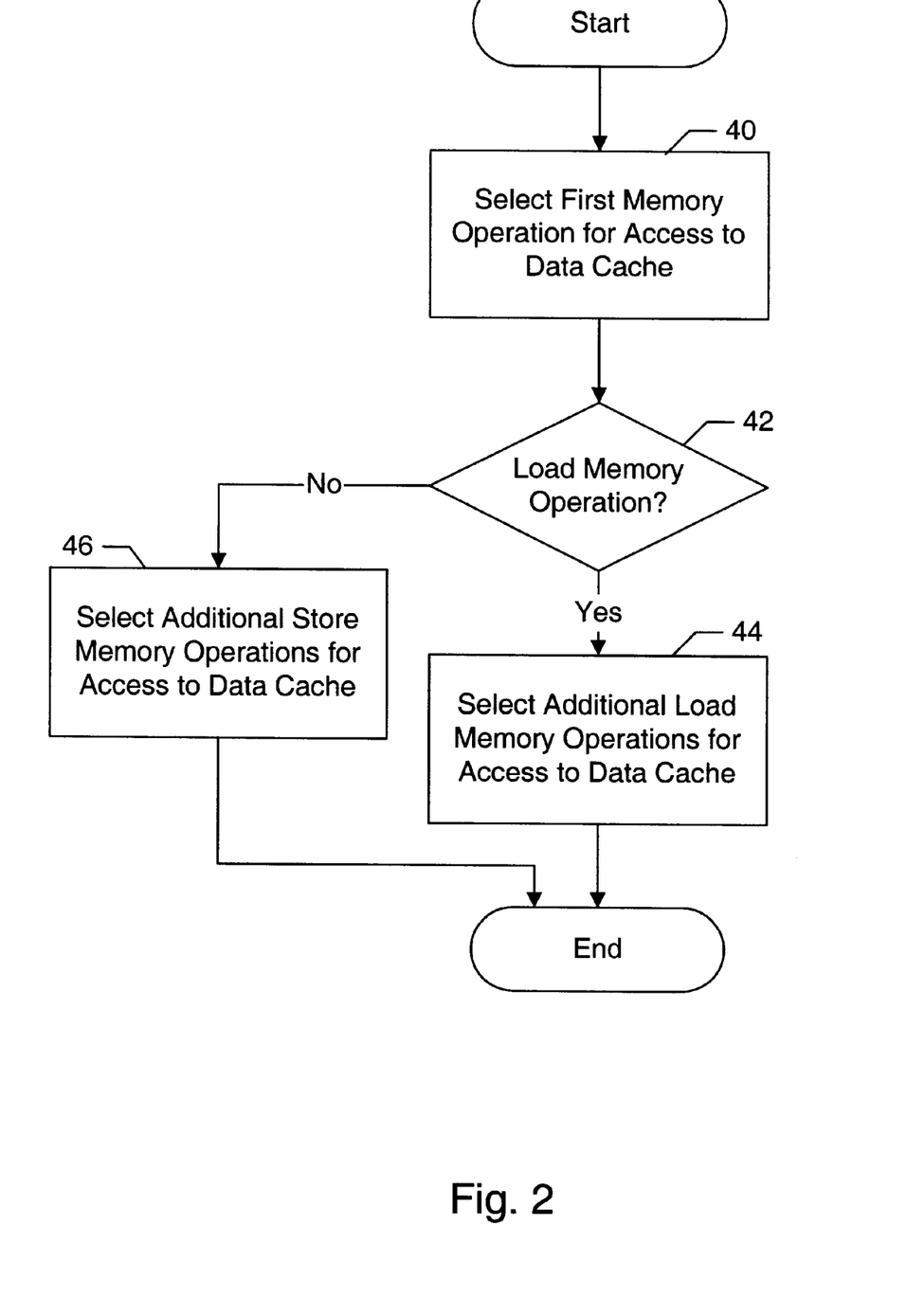
FIG. 2 is a flow chart illustrating operation of one embodiment of a load/store unit shown in FIG. 1.

Turning now to FIG. 2, a flowchart is shown illustrating operation of one embodiment of load/store unit 20. Other embodiments are possible and contemplated. The steps shown in FIG. 2 are illustrated in a particular order for ease of understanding, but any suitable order may be used. Furthermore, while steps may be shown in serial order in FIG. 2, the steps may be performed in parallel in the circuitry of load/store unit 20 as desired.

Load/store unit 20 scans the memory operations within reservation station 17F to select a first memory operation for access to data cache 14 (step 40). A variety of methods may be used to select a first memory operation. For example, load/store unit 20 may select the oldest instruction (in program order) for which all the address operands have been provided (or for which the address has been provided if load/store unit 20 does not generate addresses). On the other hand, load/store unit 20 may be configured to select load memory operations which have received address operands or addresses until the number of store memory operations which have received address operands or addresses and store data is equal to the number of ports on data cache 14. Using this method, load memory operations (which are typically more frequent and the delay of which may be performance limiting since subsequent instructions may depend on the load memory operations) are performed until a number of stores ready for data cache access is sufficient to occupy each of the ports of data cache 14.

Once a first memory operation has been selected, load/store unit 20 selects additional memory operations for access to data cache 14 based upon the type of memory operations selected in step 40 (decision block 42). If the first memory operation is a load memory operation, load/store unit 20 selects additional load memory operations up to the number of ports provided on data cache 14 (step 44). On the other hand, if the first memory operation is a store memory operation, load/store unit 20 selects additional store memory operations for access to data cache 14 (step 46).

As mentioned above, store memory operations may be performed via two accesses to data cache 14 (the first access to read the affected cache line, and the second access to update the affected cache line). In such an embodiment, if store memory operations are selected for data cache access during a clock cycle, load/store unit 20 does not select memory operations during the succeeding clock cycle.

Figure 3:
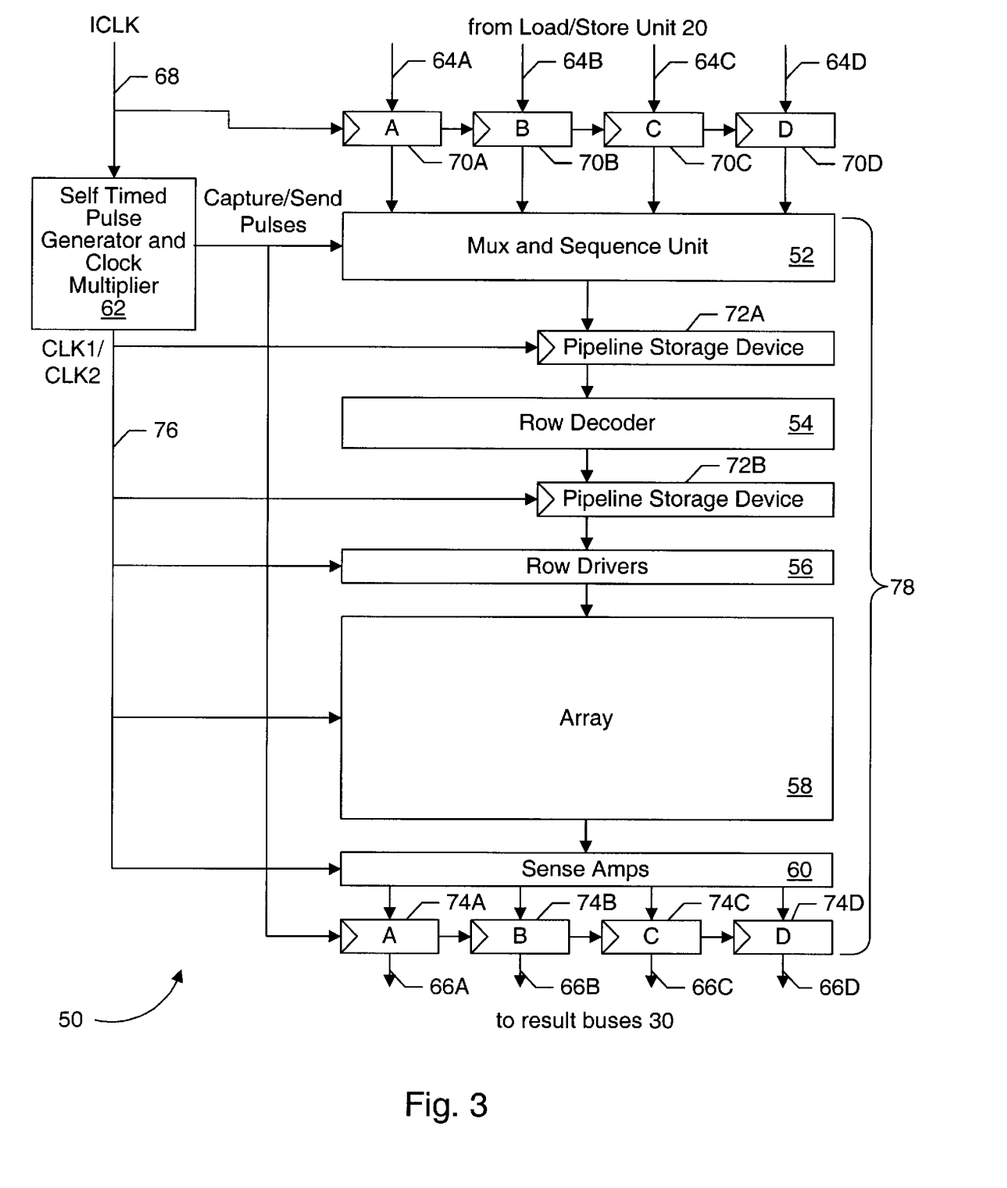
FIG. 3 is a block diagram of one embodiment of a data cache shown in FIG. 1.

Turning now to FIG. 3, a block diagram of one embodiment of the data portion 50 of data cache 14 is shown. The tag portion of data cache 14 may be organized in a similar fashion, along with tag comparators to determine if the memory operations are hits or misses within data cache 14. Other embodiments are possible and contemplated. In the embodiment of FIG. 3, data portion 50 includes a mux and sequence unit 52, a row decoder 54, a set of row drivers 56, an array 58, a set of sense amplifiers (amps) 60, and a self timed pulse generator and clock multiplier 62. Additionally, data portion 50 includes four ports 64A, 64B, 64C, and 64D. A corresponding set of data outputs 66A, 66B, 66C, and 66D are provided for forwarding load data in response to accesses on the ports 64A–64D. A corresponding set of data inputs (not shown) are also provided for conveying store data and/or fill data into data portion 50. An ICLK line 68 is coupled to self timed pulse generator and clock multiplier 62 and to a plurality of storage devices 70A–70D. Storage devices 70 are coupled to mux and sequence unit 52, which is also coupled to receive a set of capture and send pulses from self timed pulse generator and clock multiplier 62. Mux and sequence unit 52 is coupled through a pipeline storage device 72A to row decoder 54, which is further coupled through pipeline storage device 72B to row drivers 56. Row drivers 56 are coupled to array 58, which is further coupled to sense amps 60. Sense amps 60 are coupled to output storage devices 74A–74D, which are further coupled to outputs 66A–66D, respectively. Self timed pulse generator and clock multiplier 62 is configured to provide CLK1 and CLK2 signals upon a CLK1/CLK2 line 76 to storage devices 72A–72B, row drivers 56, array 58, and sense amps 60. Storage devices 70, 72, and 74 may be any suitable clocked storage device. For example, latches, registers, and flip-flops may be suitable.

Load/store unit 20 provides memory operations on ports 64A–64D during each ICLK clock cycle in which memory operations are available. The ICLK signal provided upon ICLK line 68 is the clock signal received by portions of microprocessor 10 outside of data cache 14. For the present embodiment, the memory operations provided on ports 64A–64D are captured in storage devices 70A–70D. Storage devices 70 retain the memory operations while mux and sequence unit 52 sequences the memory operations into the data cache storage pipeline according to capture and send pulses provided by self timed pulse generator and clock multiplier 62. A capture pulse and a send pulse are provided for each port. The capture pulse directs mux and sequence unit 52 to capture the value from the corresponding port, while the send pulse directs mux and sequence unit 52 to send the captured value to storage device 72A. The capture and send pulses are generated by self timed pulse generator and clock multiplier 62 as analog self timed delays from an edge of the ICLK signal. In this manner, the memory operation provided on each port 64A–64D is sequenced in turn into the single pipeline provided within data portion 50.

Self timed pulse generator and clock multiplier 62 is also configured to multiply the ICLK signal to produce the CLK1 and CLK2 signals. CLK1 and CLK2 may be non-overlapping clock signals operating at a multiple of the frequency of the ICLK signal. The frequency of the CLK1 and CLK2 signals may be any frequency which can be supported by the pipeline stages of data portion 50 and which sequences the memory operations on each port 64A–64D into data portion 50 within one period of the ICLK signal. Preferably, the frequency of the CLK1 and CLK2 signals may be a multiple of the frequency of the ICLK signal, wherein the multiple is equal to the number of ports 64.

Row decoder 54 decodes the address of each memory operation as provided by storage device 72A in order to select a row of array 58 in which data corresponding to the address may be stored. Row decoder 54 produces a set of word line signals which are used to activate the selected row within array 58 and deactivate the non-selected rows. The word line signals are stored in storage device 72B and conveyed to row drivers 56 during the subsequent clock cycle as defined by the CLK1 and CLK2 signals.

Row drivers 56 receive the word line signals and drive each word line signal to the corresponding row within array 58. Row drivers 56 are configured to assert word line signals during the active phase of CLK1 and to deassert word line signals during active phase of CLK2. Accordingly, the read (or write) of the selected row of array 58 is performed during the active phase of CLK1. As will be described below, the bit lines within array 58 may be precharged and/or balanced during the active phase of CLK2.

A read memory operation may proceed as follows: The selected row within array 58 is enabled, and the non-selected rows disabled, according to the word line signals provided by row decoder 54 and driven by row drivers 56. The storage cells within the selected row are each connected to a pair bit lines, one of which is discharged according to the value stored in the storage cells. Sense amps 60 detect the differential between the voltages upon the pair bit lines to determine the value of the bit stored in that storage cell. Sense amps 60 thereby capture the value from the selected row.

In one embodiment, a sense amp may be provided for each bit within a row of array 58 and for each port. Accordingly, the embodiment of FIG. 3 may include four sense amps per bit (one for each of the four ports). Each sense amp is coupled to an output storage device 74A–74D, which is further coupled to an output 66A–66D. Outputs 66 convey data to result bus 30 (possibly passing through a rotator/sign extend structure).

It is noted that, because of the pipeline employed by data portion 50, data is sensed by sense amps 60 at different points in time for accesses performed on different ports. Accordingly, output storage devices 74A–74D each receive a different capture pulse as generated by self timed pulse generator and clock multiplier 62 in order to capture the data corresponding to that port. Send pulses may be eliminated from storage devices 74, because storage devices 74 provide data to pipeline stages which are clocked according to the ICLK signal. Accordingly, it is desirable for the data to be available upon outputs 66A–66D for a clock period of the ICLK signal.

A write sequence may perform a read as described above, and then an update sequence which proceeds as follows: The selected row within array 58 is enabled, and the non-selected rows disabled, according to the word line signals provided by row decoder 54 and driven by row drivers 56. The pair of bit lines are driven to the value intended to be stored in the storage cell, which overwrites the previously stored value.

In the embodiment of FIG. 3, four pipeline stages are employed. Mux and sequence unit 52 may operate upon a memory operation during the first pipeline stage. The second pipeline stage may include operation of row decoder 54, followed by row drive, array access, and sensing in the third pipeline stage. Output forwarding via storage devices 74A–74D may comprise the fourth pipeline stage. Thus mux and sequence unit 52, row decoder 54, row drivers 56, array 58, sense amps 60, storage devices 74A–74D, and pipeline storage devices 72A–72B may form an exemplary pipeline 78.

While in the above description, data portion 50 has been described as including a single pipeline, embodiments are contemplated in which multiple parallel pipelines are provided. Multiple parallel pipelines might be used, for example, if physically adding multiple ports to array 58 is desirable in combination with supporting even a larger number of ports than the multiple physical ports via the pipeline of the accesses described above. For example, eight ports could be supported by providing a dual ported array and two parallel pipelines operating at four times the frequency of the ICLK signal.

Figure 4:
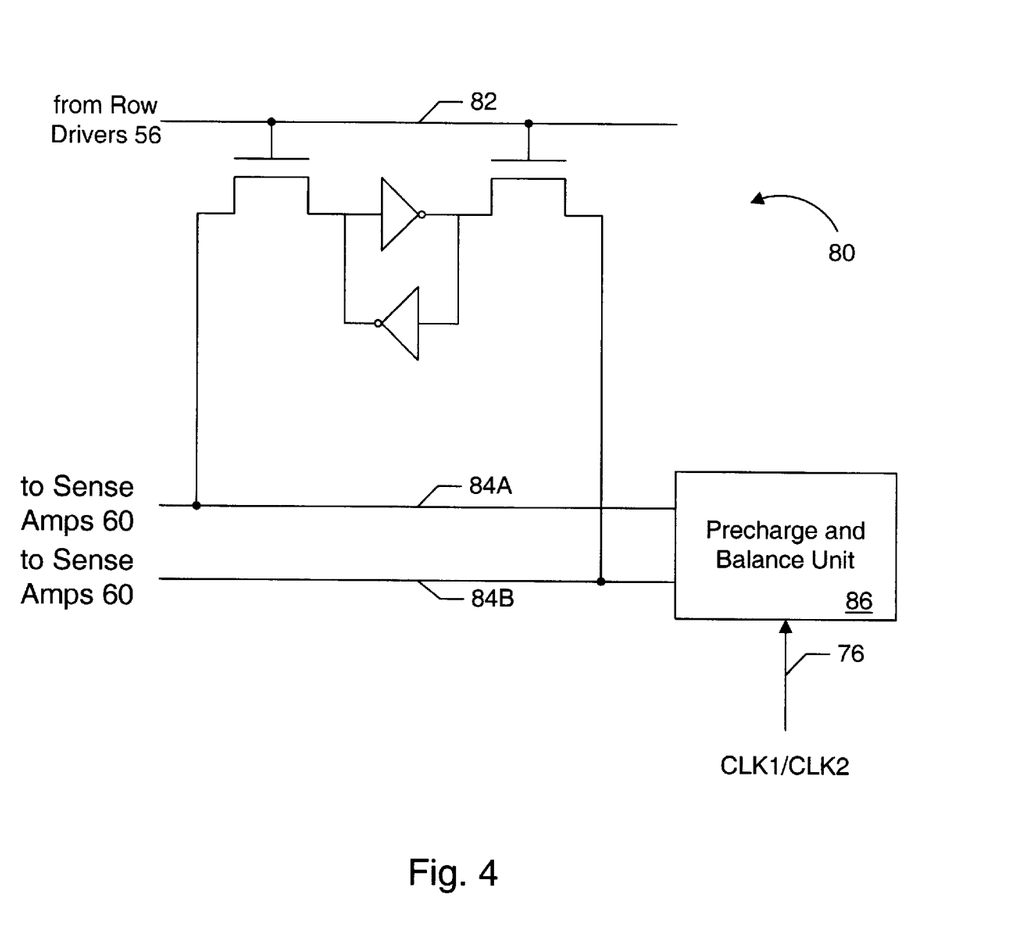
FIG. 4 is a block diagram of a portion of an array shown in FIG. 3.

Turning next to FIG. 4, a block diagram of a portion of one embodiment of array 58 is shown. Other embodiments are possible and contemplated. In the embodiment of FIG. 4, a storage cell 80 is shown coupled to a word line 82 and a pair bit lines 84A–84B. Bit lines 84A–84B are coupled to a precharge and balance unit 86, which is further coupled to CLK1/CLK2 line 76. Other storage cells coupled to the same wordline 82 and different bit lines form a row of an array 58. Other storage cells coupled to different word lines form other rows. One storage cell from each row may be coupled to bit lines 84.

If storage cell 80 is within the selected row, row drivers 56 activates word line 82. As described above, in the present embodiment, word line 82 is activated during the active phase of the CLK1 signal. Upon activation of word line 82, the nodes within storage cell 80, which store the true and complement of the value stored within storage cell 80, are coupled to the lines 84A and 84B, respectively. Sense amps 60 are coupled to bit lines 84A–84B, and are configured to sense the differential between the voltages upon bit lines 84A–84B.

Precharge and balance unit 86 is configured to either precharge bit lines 84A–84B or to balance bit lines 84A–84B. Because load/store unit 20 is configured to provide only load memory operations or only store memory operations concurrently on the ports of data cache 14, and because sense amps 60 sense the differential between bit lines 84A–84B, precharge and balance unit 86 need not fully precharge bit lines 84A–84B between each memory operation which was concurrently provided to the ports of data cache 14. If load memory operations and store memory operations were concurrently provided to the ports of data cache 14, a store memory operation (in which one of the bit lines 84A–84B is driven to a logical low state and the other bit line 84A–84B is driven to a logical high state) performed before a load memory operation would require a precharge. Typically, a balancing operation is provided subsequent to the precharge. The balancing operation ensures that substantially equal charge is provided upon both bit lines 84A and 84B.

Precharge and balance unit 86 is configured to precharge bit lines 84A–84B upon completion of the memory operation provided to port 64D. Between memory operations provided to the other ports, precharge and balance unit 86 is configured to perform only a balancing of the differential between bit lines 84A and 84B. Accordingly, the amount of time needed to perform a precharge is eliminated. The frequency at which the pipeline of data cache 14 can be operated may be increased.

As mentioned above, row drivers 56 are configured to assert word line 82 during the active phase of the CLK1 signal. Accordingly, precharge and balance unit 86 receives CLK1/CLK2 line 76 and performs balancing during the active phase of the CLK2 signal. Additionally, precharge and balance unit 86 is configured to precharge bit lines 84A–84B subsequent to completing the memory operation provided to port 64D.

Figure 5:
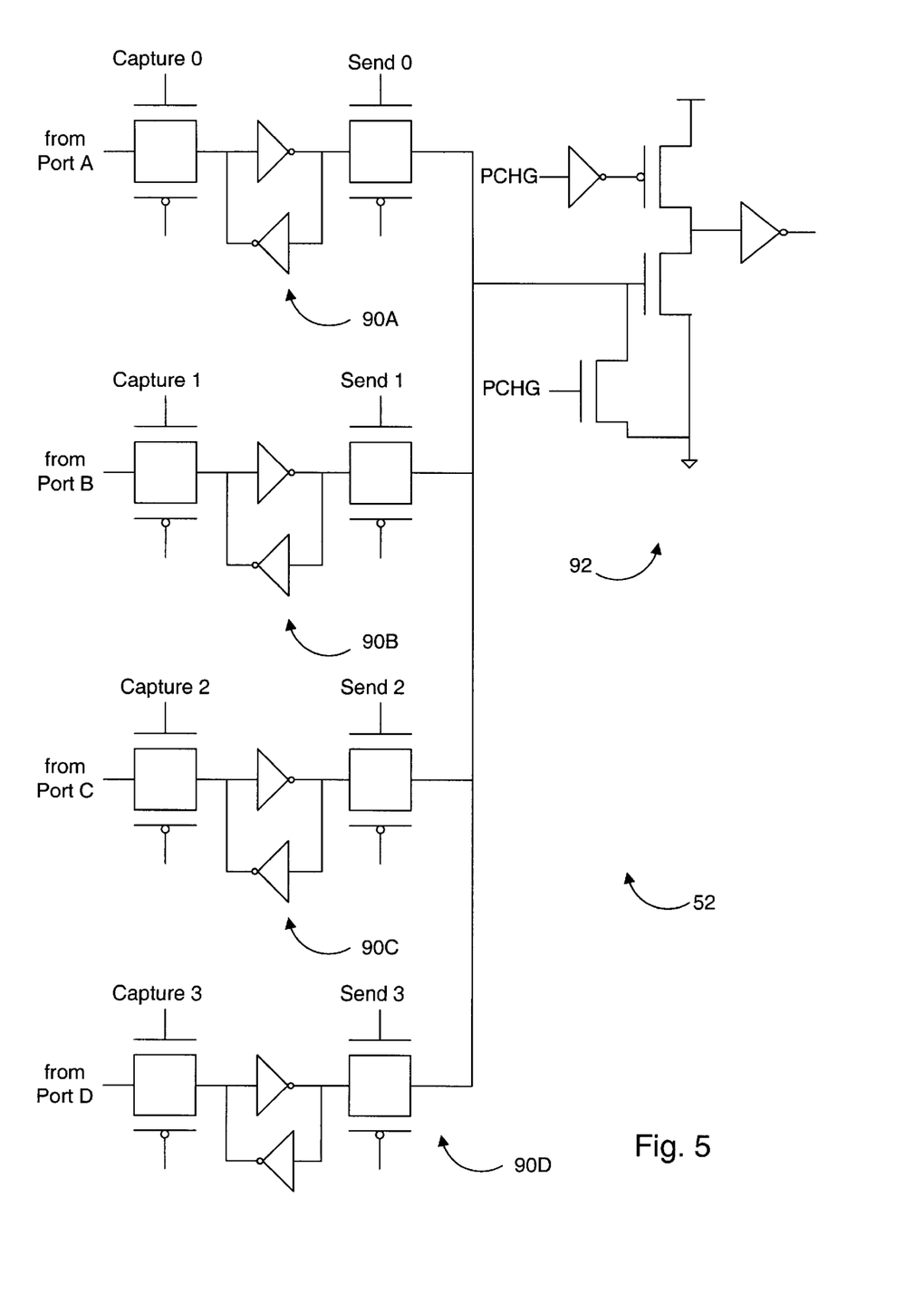
FIG. 5 is a circuit diagram of one embodiment of a multiplexer (mux) and sequence unit shown in FIG. 3.

Turning next to FIG. 5, a circuit diagram of a portion of one embodiment of mux and sequence unit 52. Other embodiments are possible and contemplated. The portion shown in FIG. 5 illustrates the mux and sequencing of one bit from each of the ports of data cache 14 to row decoder 54. Other bits may be handled in parallel in a similar fashion. It is noted that the embodiment of mux and sequence unit 52 illustrated in FIG. 5 integrates the storage functionality of storage device 72A as shown in FIG. 3, and hence storage device 72A may be deleted from an embodiment employing the embodiment of mux and sequence unit 52 shown in FIG. 5.

Mux and sequence unit 52 includes a flip-flop 90A for capturing a bit from port A (through storage device 70A in the embodiment of FIG. 3) and sending the bit to row decoder 54 through a domino-style gate 92. Similarly, a flip-flop 90B is provided for capturing a bit from port B and sending the bit to row decoder 54 through gate 92; a flip-flop 90C is provided for capturing a bit from port C and sending the bit to row decoder 54 through gate 92; a flip-flop 90D is provided for capturing a bit from port D and sending the bit to row decoder 54 through gate 92. Each of flip-flops 90 is coupled to receive a different capture and send pulse for capturing the value from a port and for sending the value to row decoder 54.

Figure 6:
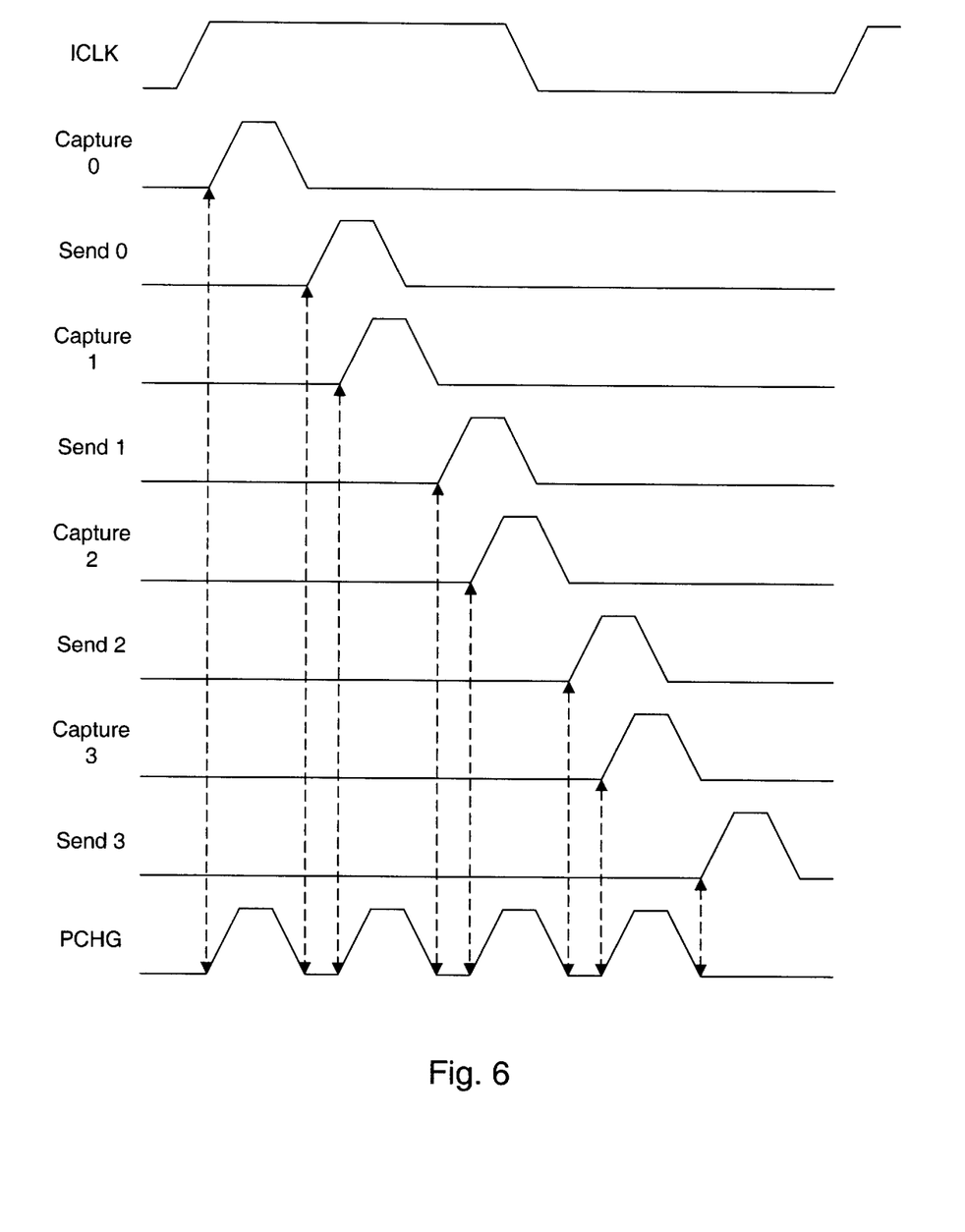
FIG. 6 is a timing diagram illustrating capture and send pulses provided to the circuit shown in FIG. 5.

FIG. 6 is a timing diagram illustrating the capture and send pulses shown on the circuit diagram of FIG. 5 as generated by one embodiment of self timed pulse generator and clock multiplier 62. Additionally, a precharge pulse for precharging gate 92 is illustrated. Vertical dotted lines illustrate timing relationships between the precharge pulse and the capture and send pulses. The ICLK signal is illustrated at the top of the timing diagram to show that the capture and send pulses complete within one period of the ICLK signal.

Figure 7:
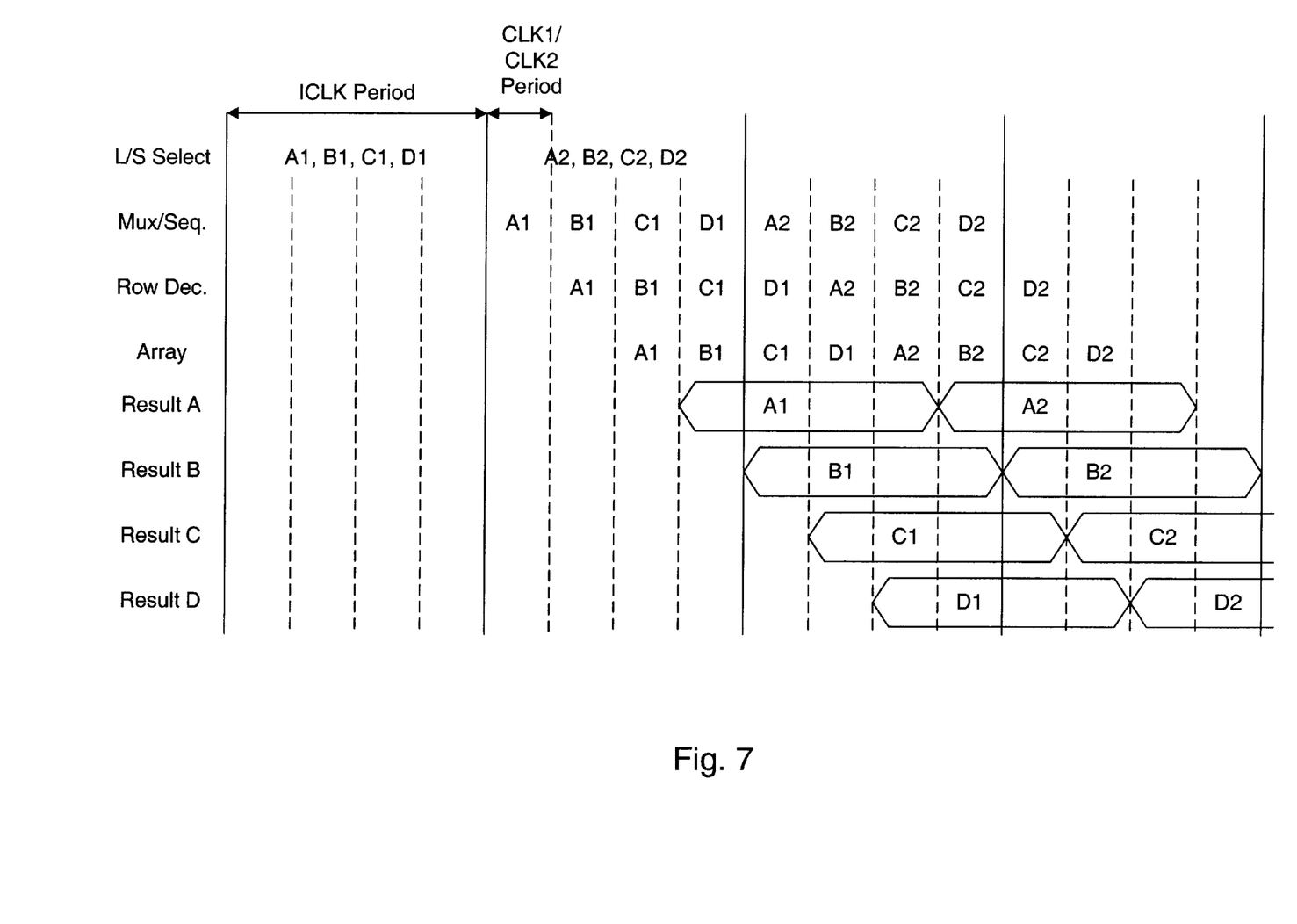
FIG. 7 is a timing diagram illustrating operation of one embodiment of the load/store unit shown in FIG. 1 and the data cache shown in FIG. 3.

Turning now to FIG. 7, a timing diagram illustrating a flow of an exemplary set of memory operations through one embodiment of data cache 14 is shown. Other embodiments are possible and contemplated. Solid vertical lines on the timing diagram of FIG. 7 delimit clock cycles as defined by the ICLK signal. Any two vertical lines (solid or dashed) delimit clock cycles as defined by the CLK1/CLK2 clock signals.

During the first clock cycle or period of the ICLK signal as shown in FIG. 7, memory operations A1, B1, C1, and D1 are selected by load/store unit 20 and are presented on the ports of data cache 14. During the second clock cycle of the ICLK signal as shown in FIG. 7, memory operations A2, B2, C2, and D2 are selected by load/store unit 20 and are presented on the ports of a cache 14.

As illustrated horizontally across the timing diagram of FIG. 7 next to the label Mux/Seq., memory operations A1, B1, C1, and DI are sequenced through mux and sequence unit 52 during consecutive clock cycles as defined by the CLK1 and CLK2 signals. The sequencing occurs during the second clock cycle as defined by the ICLK signal. Similarly, memory operations A2, B2, C2, and D2 are sequenced through mux and sequence unit 52 during consecutive clock cycles as defined by the CLK1 and CLK2 clock signals during the third clock cycle as defined by the ICLK signal. Subsequently, each memory operation flows through the row decoder stage (illustrated horizontally in FIG. 7 next to the label Row Dec.) and into the Array stage (illustrated horizontally in FIG. 7 next to the Array label). The row decoder stage is the stage in which row decoder 54 operates, while the array stage is the stage in which row drivers 56, array 58, and sense amps 60 operate.

FIG. 7 further illustrates providing the result of each memory operation at the outputs of data cache 14. Output 66A is illustrated horizontally next to the label Result A. Similarly, output 66B is illustrated horizontally next to the label Result B; output 66C is illustrated horizontally next to the label Result C; and output 66D is illustrated horizontally next to the label Result D. As FIG. 7 shows, data corresponding to a memory operation that is presented on each port is available for the full period of the ICLK signal, but at different points in time within the clock cycle. Accordingly, sampling of the results may be timed according to the port, or timed such that the result from any port may be sampled.

Figure 8:
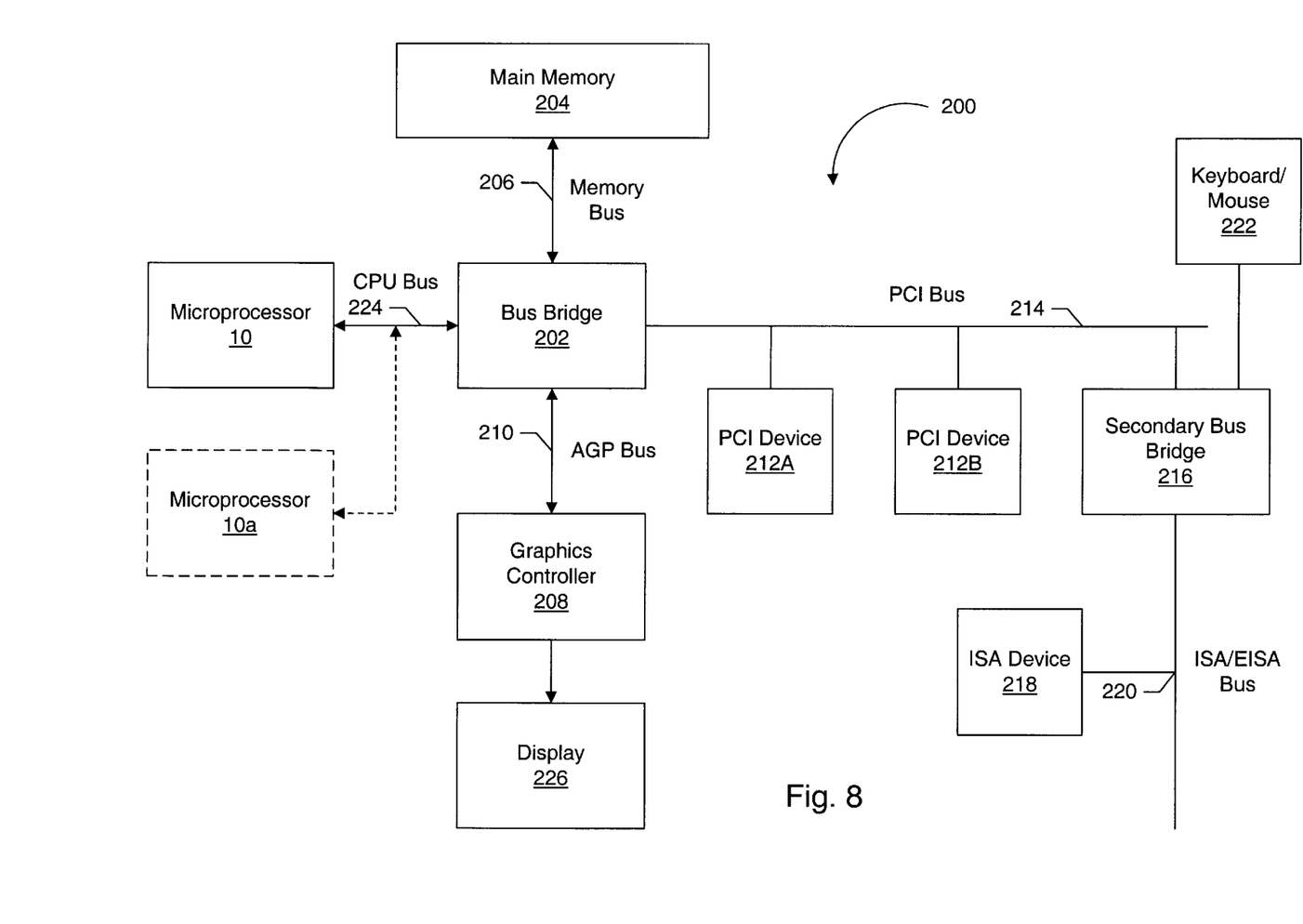
FIG. 8 is a block diagram of a computer system including the microprocessor shown in FIG. 1.

Turning now to FIG. 8, a block diagram of one embodiment of a computer system 200 including microprocessor 10 coupled to a variety of system components through a bus bridge 202 is shown. Other embodiments are possible and contemplated. In the depicted system, a main memory 204 is coupled to bus bridge 202 through a memory bus 206, and a graphics controller 208 is coupled to bus bridge 202 through an Advanced Graphics Port (AGP) bus 210. Finally, a plurality of Peripheral Component Intercorret (PCI) devices 212A–212B are coupled to bus bridge 202 through a PCI bus 214. A secondary bus bridge 216 may further be provided to accommodate an electrical interface to one or more Extended Industry Standard Architecture (EISA) or ISA, Industry Standard Architecture (ISA) devices 218 through an EISA/ISA bus 220. Microprocessor 10 is coupled to bus bridge 202 through a Central Processing Unit (CPU) bus 224.

Bus bridge 202 provides an interface between microprocessor 10, main memory 204, graphics controller 208, and devices attached to PCI bus 214. When an operation is received from one of the devices connected to bus bridge 202, bus bridge 202 identifies the target of the operation (e.g. a particular device or, in the case of PCI bus 214, that the target is on PCI bus 214). Bus bridge 202 routes the operation to the targeted device. Bus bridge 202 generally translates an operation from the protocol used by the source device or bus to the protocol used by the target device or bus.

In addition to providing an interface to an ISA/EISA bus for PCI bus 214, secondary bus bridge 216 may further incorporate additional functionality, as desired. For example, in one embodiment, secondary bus bridge 216 includes a master PCI arbiter (not shown) for arbitrating ownership of PCI bus 214. An input/output controller (not shown), either external from or integrated with secondary bus bridge 216, may also be included within computer system 200 to provide operational support for a keyboard and mouse 222 and for various serial and parallel ports, as desired. An external cache unit (not shown) may further be coupled to CPU bus 224 between microprocessor 10 and bus bridge 202 in other embodiments. Alternatively, the external cache may be coupled to bus bridge 202 and cache control logic for the external cache may be integrated into bus bridge 202.

Main memory 204 is a memory in which application programs are stored and from which microprocessor 10 primarily executes. A suitable main memory 204 comprises DRAM (Dynamic Random Access Memory), and preferably a plurality of banks of SDRAM (Synchronous DRAM).

PCI devices 212A–212B are illustrative of a variety of peripheral devices such as, for example, network interface cards, video accelerators, audio cards, hard or floppy disk drives or drive controllers, SCSI (Small Computer Systems Interface) adapters and telephony cards. Similarly, ISA device 218 is illustrative of various types of peripheral devices, such as a modem, a sound card, and a variety of data acquisition cards such as General Purpose Interface (GPIB) or field bus interface cards.

Graphics controller 208 is provided to control the rendering of text and images on a display 226. Graphics controller 208 may embody a typical graphics accelerator generally known in the art to render three-dimensional data structures which can be effectively shifted into and from main memory 204. Graphics controller 208 may therefore be a master of AGP bus 210 in that it can request and receive access to a target interface within bus bridge 202 to thereby obtain access to main memory 204. A dedicated graphics bus accommodates rapid retrieval of data from main memory 204. For certain operations, graphics controller 208 may further be configured to generate PCI protocol transactions on AGP bus 210. The AGP interface of bus bridge 202 may thus include functionality to support both AGP protocol transactions as well as PCI protocol target and initiator transactions. Display 226 is any electronic display upon which an image or text can be presented. A suitable display 226 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 200 may be a multiprocessing computer system including additional microprocessors (e.g. microprocessor 10a shown as an optional component of computer system 200). Microprocessor 10a may be similar to microprocessor 10. More particularly, microprocessor 10a may be an identical copy of microprocessor 10. Microprocessor 10a may share CPU bus 224 with microprocessor 10 (as shown in FIG. 8) or may be connected to bus bridge 202 via an independent bus.

In accordance with the above disclosure, a data cache has been shown which provides multiporting through pipelining of the data cache and operating the pipeline at a multiple of the clock frequency employed within the remainder of the microprocessor. Advantageously, multiple accesses per clock cycle may be accomplished without physical multiporting of the cache or banking of the cache.

Numerous variations and modifications will become apparent to those skilled in the art once the above disclosure is fully appreciated. It is intended that the following claims be interpreted to embrace all such variations and modifications.

What is claimed is:

1. A cache comprising:
a plurality of ports operating, during use, at a first clock frequency, each of said plurality of ports configured to concurrently receive a different cache access according to a first clock signal having said first clock frequency; and
a pipeline coupled to said plurality of ports, wherein said pipeline comprises a plurality of pipeline stages and is configured to select, into the pipeline, one cache access per clock cycle of a second clock signal having a second clock frequency, said second clock frequency being a multiple of said first clock frequency, the cache accesses selected in consecutive clock cycles of the second clock signal being selected from different ones of the plurality of ports, and wherein the multiple is greater than one, and wherein each of said plurality of pipeline stages is coupled to receive said second clock signal and is configured to operate responsive to the second clock signal.

2. The cache as recited in claim 1 wherein said pipeline comprises a mux and sequence unit coupled to said plurality of ports, wherein said mux and sequence unit is configured to sequence cache accesses presented to said plurality of ports at a rate of one access per clock cycle of said second clock signal.

3. The cache as recited in claim 2 wherein said mux and sequence unit is included in a first stage of said plurality of pipeline stages.

4. The cache as recited in claim 3 wherein said mux and sequence unit is configured to receive a set of capture and send pulses, and wherein said mux and sequence unit is configured to mux and sequence one of said cache accesses per capture and send pulse received.

5. The cache as recited in claim 4, wherein said pipeline further comprises a row decoder coupled to said mux and sequence unit, wherein said row decoder is configured to decode an address of said one of said cache accesses provided by said mux and sequence unit, and wherein said row decoder is included in a second stage of said plurality of pipeline stages.

6. The cache as recited in claim 5 wherein said pipeline further comprises a set of row drivers coupled to said row decoder, an array coupled to said set of row drivers, and a set of sense amplifiers coupled to said array, wherein said set of row drivers, said array, and said set of sense amplifiers are included in a third stage of said plurality of pipeline stages.

7. The cache as recited in claim 6 wherein said array comprises a pair of bit lines for each bit stored in a row, and wherein said array is configured to balance the pairs of bit lines between cache accesses concurrently provided to said plurality of ports instead of precharging the pairs of bit lines.

8. The cache as recited in claim 7 wherein said array is configured to precharge the pairs of bit lines subsequent to access by the cache accesses concurrently provided to said plurality of ports and prior to subsequent cache accesses.

9. The cache as recited in claim 6 wherein said pipeline further comprises a plurality of outputs coupled to said set of sense amplifiers, wherein said plurality of outputs are configured to convey data read in response to load memory operations on said plurality of ports, wherein said plurality of outputs are included within a fourth stage of said pipeline.

10. The cache as recited in claim 9 wherein said multiple is four and the number of said plurality of ports is four.

11. A processor comprising:
a data cache having a plurality of ports; and
a load/store unit coupled to said data cache, said load/store unit configured to select a memory operation for each of said plurality of ports, wherein said load/store unit is configured to select a first load memory operation for presentation on a first one of said plurality of ports and to select only load memory operations for concurrent presentation on remaining ones of said plurality of ports responsive to selecting said first load memory operation for presentation on said first one of said plurality of ports, and wherein said load store unit is configured to select a first store memory operation for presentation on said first one of said plurality of ports and to select only store memory operations for concurrent presentation on said remaining ones of said plurality of ports responsive to selecting said first store memory operation for presentation of said first one of said plurality of ports.

12. The processor as recited in claim 11 wherein said data cache comprises an array having a number of ports less than the number of said plurality of ports of said data cache, said array operating, during use, at a first clock frequency which is a multiple of a second clock frequency at which said load/store unit operates, during use.

13. The processor as recited in claim 12 wherein said data cache is pipelined in stages operating, during use, at said first clock frequency.

14. The processor as recited in claim 13 wherein said data cache includes a first pipeline stage comprising a mux and sequence unit coupled to said plurality of ports, wherein said mux and sequence unit is configured to sequence memory operations presented to said plurality of ports at a rate of one memory operation per clock cycle of a first clock signal operating, during use, at said first clock frequency.

15. The processor as recited in claim 14 wherein said data cache includes a second pipeline stage comprising a row decoder coupled to said mux and sequence unit, wherein said row decoder is configured to decode an address of one of said memory operations provided by said mux and sequence unit.

16. The processor as recited in claim 15 wherein said data cache includes a third pipeline stage comprising a set of row drivers coupled to said row decoder, an array coupled to said set of row drivers, and a set of sense amplifiers coupled to said array.

17. The processor as recited in claim 16 wherein said data cache includes a fourth pipeline stage comprising a plurality of outputs coupled to said set of sense amplifiers, wherein said plurality of outputs are configured to convey data read in response to load memory operations on said plurality of ports.

18. The processor as recited in claim 16 wherein said array comprises a pair of bit lines for each bit stored in a row, and wherein said array is configured to balance the pairs of bit lines between memory operations concurrently provided to said plurality of ports instead of precharging the pairs of bit lines.

19. The processor as recited in claim 18 wherein said array is configured to precharge the pairs of bit lines subsequent to access by the memory operations concurrently provided to said plurality of ports and prior to subsequent memory operations.

20. A computer system comprising:
a processor including a data cache, said data cache having a plurality of ports, and a load/store unit configured to select a memory operation for each of said plurality of ports, wherein said load/store unit is configured to select only load memory operations for concurrent presentation on said plurality of ports or only store memory operations for concurrent presentation on said plurality of ports, and wherein said data cache comprises an array having a number of ports less than the number of said plurality of ports of said data cache, said array operating, during use, at a first clock frequency which is a multiple of a second clock frequency at which said load/store unit operates, during use, and wherein said data cache is pipelined in stages operating, during use, at said first clock frequency to provide access from each of said plurality of ports; and
a peripheral device configured to provide communication external to said computer system.

21. The cache as recited in claim 1 wherein the multiple is equal to the number of said plurality of ports.

22. A computer system comprising:
a processor comprising:
a data cache having a plurality of ports; and
a load/store unit coupled to said data cache, said load/store unit configured to select a memory operation for each of said plurality of ports, wherein said load/store unit is configured to select a first load memory operation for presentation on a first one of said plurality of ports and to select only load memory operations for concurrent presentation on remaining ones of said plurality of ports responsive to selecting said first load memory operation for presentation on said first one of said plurality of ports, and wherein said load store unit is configured to select a first store memory operation for presentation on said first one of said plurality of ports and to select only store memory operations for concurrent presentation on said remaining ones of said plurality of ports responsive to selecting said first store memory operation for presentation of said first one of said plurality of ports; and
a peripheral device configured to provide communication external to said computer system.

23. A method comprising:
receiving a first cache access on a first port of a cache during a first clock cycle of a first clock signal, the first port operating responsive to said first clock signal which has a first clock frequency;
receiving a second cache access on a second port of a cache during the first clock cycle, the second port operating responsive to said first clock signal;
selecting said first cache access from said first port into a pipeline of said cache during a second clock cycle of the second clock signal, the pipeline comprising a plurality of pipeline stages for performing cache accesses, the plurality of pipeline stages operating responsive to the second clock signal which has a second clock frequency which is a multiple of the first clock frequency, the multiple being greater than one; and
selecting said second cache access from said second port into said pipeline during a third clock cycle of the second clock signal consecutive to the second clock cycle.

24. The method as recited in claim 23 wherein said selecting said first cache access and said selecting said second cache access are performed in a first stage of the plurality of pipeline stages.

25. The method as recited in claim 24 further comprising decoding an address in a second stage of the plurality of pipeline stages.

26. The method as recited in claim 25 further comprising accessing an array in a third stage of the plurality of pipeline stages.

27. The method as recited in claim 26 further comprising balancing pairs of bit lines in said array between cache accesses instead of precharging.

28. The method as recited in claim 27 further comprising precharging the pairs of bit lines prior to receiving a third cache access on said first port during a fourth clock cycle of said first clock signal, the fourth clock cycle being consecutive to the first clock cycle.

29. The method as recited in claim 26 further comprising driving array output data accessed from said array in a fourth stage of said plurality of pipeline stages.

30. The method as recited in claim 23 wherein said multiple is equal to a number of ports on the cache.

31. A method comprising:
selecting either a first load memory operation or a first store memory operation for presentation on a first port of a plurality of ports on a cache;
selecting only additional load memory operations for concurrent presentation on remaining ones of said plurality of ports responsive to selecting said first load memory operation; and
selecting only additional store memory operations for concurrent presentation on said remaining ones of said plurality of ports responsive to selecting said first store memory operation.

32. A processor comprising:
a data cache having a plurality of ports; and
a load/store unit coupled to said data cache, said load/store unit configured to select a memory operation for each of said plurality of ports, wherein said load/store unit is configured to select only load memory operations for concurrent presentation on said plurality of ports or only store memory operations for concurrent presentation on said plurality of ports;
wherein said data cache comprises an array having a number of ports less than the number of said plurality of ports of said data cache, said array operating, during use, at a first clock frequency which is a multiple of a second clock frequency at which said load/store unit operates, during use.

33. The processor as recited in claim 32 wherein said data cache is pipelined in stages operating, during use, at said first clock frequency.

34. The processor as recited in claim 33 wherein said data cache includes a first pipeline stage comprising a mux and sequence unit coupled to said plurality of ports, wherein said mux and sequence unit is configured to sequence memory operations presented to said plurality of ports at a rate of one memory operation per clock cycle of a first clock signal operating, during use, at said first clock frequency.

35. The processor as recited in claim 34 wherein said data cache includes a second pipeline stage comprising a row decoder coupled to said mux and sequence unit, wherein said row decoder is configured to decode an address of one of said memory operations provided by said mux and sequence unit.

36. The processor as recited in claim 35 wherein said data cache includes a third pipeline stage comprising a set of row drivers coupled to said row decoder, an array coupled to said set of row drivers, and a set of sense amplifiers coupled to said array.

37. The processor as recited in claim 36 wherein said data cache includes a fourth pipeline stage comprising a plurality of outputs coupled to said set of sense amplifiers, wherein said plurality of outputs are configured to convey data read in response to load memory operations on said plurality of ports.

38. The processor as recited in claim 36 wherein said array comprises a pair of bit lines for each bit stored in a row, and wherein said array is configured to balance the pairs of bit lines between memory operations concurrently provided to said plurality of ports instead of precharging the pairs of bit lines.

39. The processor as recited in claim 38 wherein said array is configured to recharge the pairs of bit lines subsequent to access by the memory operations concurrently provided to said plurality of ports and prior to subsequent memory operations.

* * * * *